United States Patent [19]

Wolaver

[11] Patent Number: 4,902,920
[45] Date of Patent: Feb. 20, 1990

[54] EXTENDED RANGE PHASE DETECTOR

[75] Inventor: Dan H. Wolaver, Brookfield, Mass.

[73] Assignee: General Signal Corporation, N.Y.

[21] Appl. No.: 249,283

[22] Filed: Sep. 26, 1988

[51] Int. Cl.$^4$ .......................... H03K 5/26; H03K 5/00
[52] U.S. Cl. ..................................... 307/514; 307/479;
307/262; 328/133; 328/155; 328/109
[58] Field of Search ............... 307/479, 510, 511, 514,
307/262; 328/133, 109, 155, 55

[56] References Cited

U.S. PATENT DOCUMENTS

| | | | |
|---|---|---|---|
| 3,662,159 | 5/1972 | Schief | 377/47 |
| 3,723,889 | 3/1973 | Oberst | 328/134 |
| 3,936,762 | 2/1976 | Cox, Jr. et al. | 375/120 |
| 3,944,940 | 3/1976 | Desai | 329/122 |
| 3,959,601 | 5/1976 | Olevsky et al. | 375/120 |
| 3,989,931 | 11/1976 | Phillips | 328/134 |
| 4,015,083 | 3/1977 | Bellisio | 375/120 |
| 4,030,045 | 6/1977 | Clark | 331/1 A |
| 4,105,946 | 8/1978 | Ikeda | 331/1 A |
| 4,206,425 | 6/1980 | Nossen | 332/19 |
| 4,215,245 | 7/1980 | Bellisio | 370/84 |
| 4,264,866 | 4/1981 | Benes | 328/134 |
| 4,276,512 | 6/1981 | Wittke | 328/133 |
| 4,280,104 | 7/1981 | Rzeszewski | 331/1 A |
| 4,308,505 | 12/1981 | Messerschmitt | 331/25 |
| 4,321,555 | 3/1982 | Houk et al. | 331/1 A |
| 4,344,045 | 8/1982 | Das et al. | 331/1 A |
| 4,375,693 | 3/1983 | Kuhn | 375/120 |
| 4,495,468 | 1/1985 | Richards et al. | 328/155 |
| 4,502,014 | 2/1985 | Bismarck | 328/133 |
| 4,547,747 | 10/1985 | Wolaver et al. | 331/17 |
| 4,587,496 | 5/1986 | Wolaver | 307/526 |
| 4,590,602 | 5/1986 | Wolaver | 375/91 |
| 4,682,116 | 7/1987 | Wolaver et al. | 328/167 |
| 4,694,259 | 9/1987 | Carickholt et al. | 331/1 A |

OTHER PUBLICATIONS

"Generalized Phase Comparators for Improved Phased—Locked Loop Acquistion", IEEE Transaction on Comm Tech, vol. Com-19 No. 6, pp. 145-148.
"GaAs Monolithic Digital Phase—Frequency Discriminator", IEEE GaAsic Symposium, pp. 183-186, 1985.
"Frequency Detectors for PLL Acquistion in Timing and Carrier Recovery", Messerschmitt, IEEE Comm. Tech. vol. 27, No. 9, Sep. 1979.

Primary Examiner—Andrew J. James
Assistant Examiner—Richard Roseen
Attorney, Agent, or Firm—Barnes & Thornburg

[57] ABSTRACT

A linear three-state phase detector capable of accurately responding to simultaneous input signals has its linear range extended by uniquely sensing cycle slip and stepping a binary up-down counter. The cycle slip detector is capable of handling simultaneous inputs by determining that a resulting change of the three-state phase detector output occurs after a predetermined time after an input signal.

21 Claims, 9 Drawing Sheets

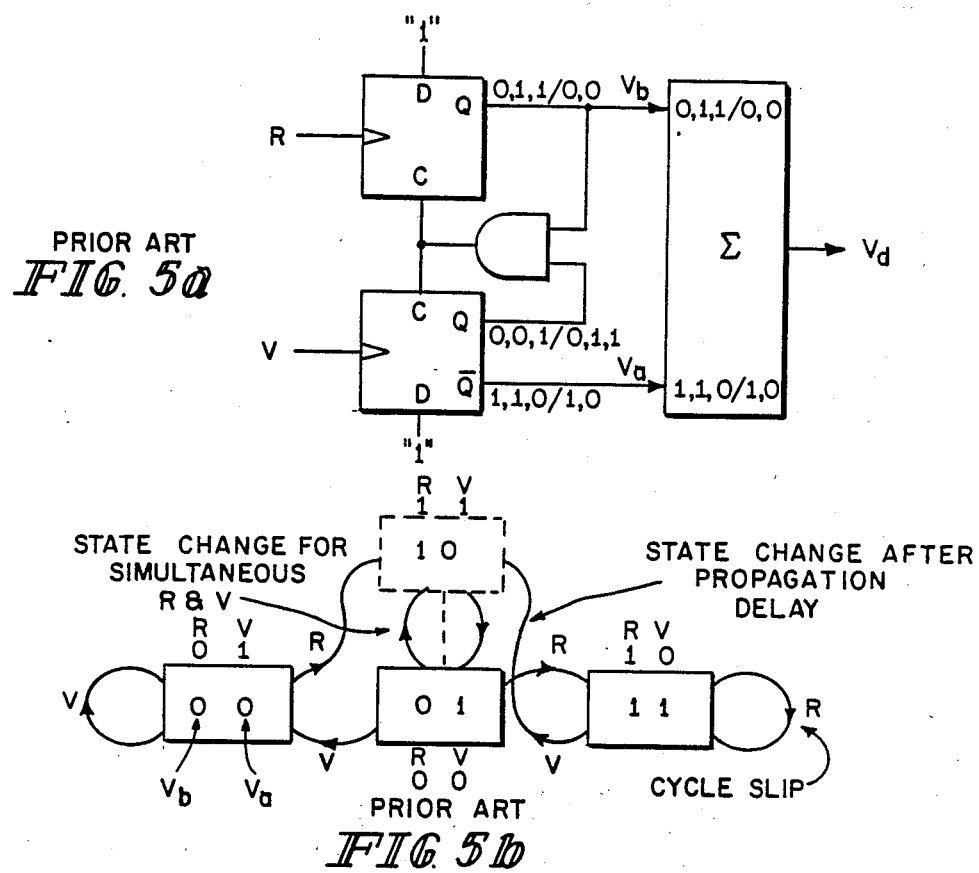
PRIOR ART
FIG. 5a
PRIOR ART
FIG. 5b
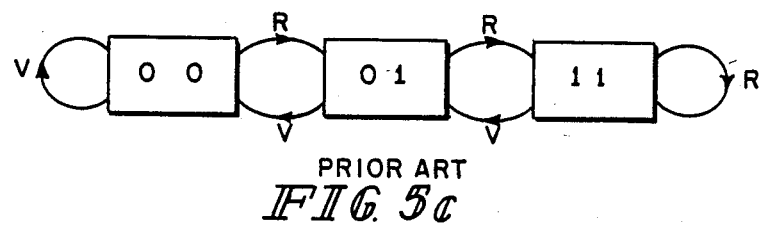
PRIOR ART
FIG. 5c
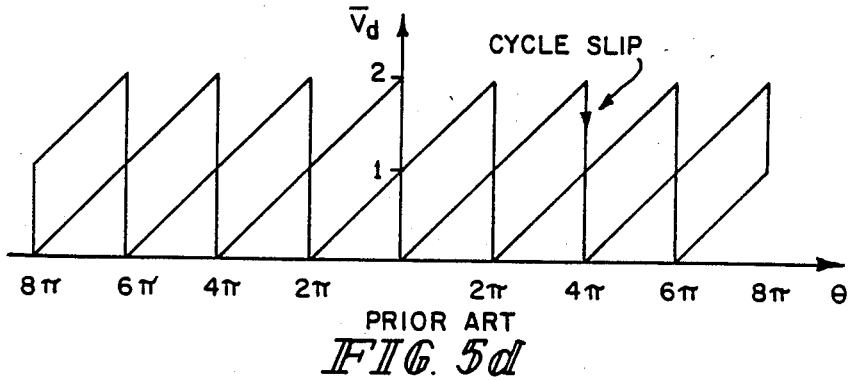
PRIOR ART
FIG. 5d

EXTENDED RANGE PHASE DETECTOR

BACKGROUND AND SUMMARY OF THE INVENTION

The present invention is related generally to extended range phase detectors and more specifically to an extended range phase detector with larger linear range having an output whose fundamental frequency is at least as high as the fundamental frequency of the input signals.

It is well known in the art that a phase detector with a linear characteristic over a phase range of $2\pi$ can be easily realized with digital logic (see FIG. 1). The circuit here can be described as a one-stage bi-directional shift register whose output $V_d$ upon a rising edge on U, and a 0 upon a rising edge on D. This can also be described as an edge-sensitive R-S flip-flop. The phase detector characteristic $\overline{V}_d$ is the average of the output of $V_d$. The averaging serves to remove frequencies contained in $V_d$ that are also contained in U and D.

It is also well known in the art that the range of the Phase detector in FIG. 1 can be extended by preceding it with frequency dividers (see FIG. 2). Here the dividers cause the frequency of U to be one-third that of R and the frequency of D to be one-third that of V. As a result, the phase range is extended by a factor of 3 to $6\pi$. However, the output $V_d$ now contains frequencies that are one-third of those in R and V. This effectively triples the time required to produce $\overline{V}_d$ and adversely restricts the response time of the phase detector.

Techniques are already known for extending the range of the phase detector in FIG. 1 without reducing the frequencies in $V_d$. In *Generalized Phase Comparators for Improved Phased-Locked Loop Acquisition*, IEEE Transactions on Communication Technology, Volume COM-19, No. 6, pp. 145-148, December 1971, Oberest cites the n-stage "bi-directional shift register" (BSR) and the "asynchronous delay line" (ADL). In fact, he shows that these are equivalent. A three-state BSR is shown in FIG. 3a. The output $V_d$ is the sum of the signals $V_1$, $V_2$, $V_3$. The effect of the inputs U and D on $V_1$, $V_2$, $V_3$ is shown by the state diagram in FIG. 3b. Each rising edge of U causes another V to be 1, and each rising edge of D causes one less V to be a 1 (one more V to be a 0). If the BSR is in the 111 state, a rising edge of U causes no change; this is called a "cycle slip". If the BSR is in the 000 state, a phase change of $6\pi$ corresponds to three more rising edges of U than of D. This advances the BSR to the 111 state, increasing $V_d$ by 3. The linear range can be extended further to $2n\pi$ by using an n-stage BSR. However, there is a "problem of simultaneous input pulses" (Oberest, p. 1146 supra). If the rising edges of U and D are too close to each other, the effect of one edge will be lost, and the output of the phase detector becomes in error. Simple attempts at fixing this problem lead to "dead zones" or non-linearities in the characteristic.

The most general characterization of the function served by the BSR in FIG. 3a is an "up-down" counter. The count, in the case of the BSR, is represented by the number of V's that are 1's. An example of another up-down counter is shown in FIG. 4a. Here the count is represented by the V's as a binary number (base-two number) To convert this count to an analog voltage $V_d$, the V's must be weighted before summing:

$$V_d = V_1 + 2V_2 + \ldots + 2^{n-1}V_n.$$

It may be noted that Oberest, in U.S. Pat. No. 3,723,889, extends the range of a phase detector and achieves a characteristic identical to that in FIG. 3c without "dead zones" or non-linearities. However, the frequency dividers (divide by N counters) he uses produce frequencies in $V_d$ that are lower than (1/N of) the frequencies in U and D.

Techniques are already known for realizing a $4\pi$-range phase detector with no dead zones. As described by Shahriary et al. in an article titled *GaAs Monolithic Digital Phase-Frequency Discriminator*, IEEE GaAs Symposium, pp. 183-186, 1985, such a circuit is shown in FIG. 5a. The state diagram in FIG. 5b shows the effect of the inputs R and V, and a simplified state diagram is shown in FIG. 5c. From this simplified state diagram, it can be seen that the circuit effectively realized a two-stage BSR (compare FIG. 3b). The circuit avoids the problem of simultaneous inputs by the existence of a fourth state 10. This is a momentary state that quickly reverts to state 01. Since states 10 and 01 both produce $V_d = 1$, the two states can be considered as one, as in FIG. 5c. The resulting phase detector characteristic with a linear range of $4\pi$ is shown in FIG. 5d. However, there has heretofore been no way of extending the phase range of this circuit. It should be noted that FIG. 5a represents the device described in the Shahriary article using D flip-flops instead of the RS flip-flops described in Shahriary.

In my U.S. Pat. No. 4,587,496, I describe in FIG. 5 a proportional frequency detector including an up-down counter 50, whose output is connected to an overflow and underflow multivibrator 56, 58 whose output is summed in summer 60. The multivibrators 56, 58 are connected so as to operate as slip cycle detectors. A two-state up-down counter is illustrated in FIG. 7 and a three-state up-down counter is illustrated in FIG. 9. In this context, the frequency detector is only concerned that slips are occuring and the direction. A delay insures that simultaneous inputs do not cause a slip to be missed, but as a result one slip causes multiple slips to be recorded. Thus, this circuitry was not considered for a phase detector which overcame the problems of the prior art.

Thus, it is an object of the present invention to provide an extended range phase detector whose output has a fundamental frequency at least as high as the fundamental frequency of its input signal.

Another object of the present invention is to provide a phase detector having a large linear range without dead zones and non-linearities.

A still even further object of the present invention is to indefinitely extend the range of a linear non-dead zone phase detector.

A still even further object of the present invention is to provide an extended range phase detector of an arbitrarily large linear range capable of handling simultaneously occurring input signals without error.

These and other objects are attained by using a three-state phase detector which is caPable of handling simultaneously occurring input signals accurately without dead zones or non-linearities and extending its range by using cycle slip detectors driving an up-down counter to extend the range of the three-state phase detector as cycle slips occur. The output of the three-state phase detector is combined with the output of the up-down counter to provide n+1 cycles of linear phase detection where n is the states of the up-down counter.

The three-state phase detector provides an output signal representing a lead state, a lag state and a center state. The three-state phase detector basically has a pair of outputs and a transition state. A pair of flip-flops receives respective input signals and provides one of a respective output signal. Logic is provided to reset the flip-flops when both of the flip-flops are in a set state simultaneously. This causes the appropriate transition state to occur, and only three stable states with four possible states are provided at the output of the three-state phase detector The two outputs of the phase detector are the Q and $\bar{Q}$ outputs respectively of the first and second flip-flops.

The cycle slip detector provides an up signal when the first input leads the second input by more than one cycle and a down signal when the first input lags the second input by more than one cycle. To accomplish this while accommodating simultaneous inputs, the cycle slip detector includes a lead circuit for providing the up signal when a first resulting change of the output signals of the three-state phase detector occurs after a predetermined time after the first input signal and a lag circuit for providing the down signal when a second resulting change of the output signals of the three-state phase detector occurs after the predetermined time after the second input signal. The lead and lag circuits of the cycle slip detector each include a timer initiated by a respective first or second input signal for providing a time-out signal after expiration of the predetermined time, an input flip-flop set by a respective first or second predetermined change of the output signal of the three-state phase detector and reset by the time-out signal, and an output flip-flop set by simultaneous occurrence of the time-out signal and a set signal from the input flip-flop and providing a respective up-down signal at its reset output.

The up-down counter may be an n-stage binary up-down counter with its outputs binarily weighted, or an n-stage bi-directional shift register. The output circuit includes digital-to-analog converters which convert the output of the up-down counter to an analog signal to be added with the digital-to-analog converted output of the three-state phase detector and an adder for adding the two analog signals.

Alternatively, a digital phase output can be produced by processsing the output of the three-state phase detector to provide a digital output representing the three states. The output of the up-down counter is provided to a digital adder which adds the most significant bit of the digital word form the three-state phase detector to the least significant bit of the output of the up-down counter. The total binary output has one less bit than the sum of the number of bits form the binary up-down counter and the digital output from the three-state phase detector.

Other objects, advantages and novel features of the present invention will become apParent from the following detailed description of the invention when considered in conjunction with the accompanying drawings

BRIEF DESCRIPTION OF THE DRAWINGS

FIG. 3b is a transition state of the device of FIG. 3a.

FIG. 3c is a graph of the output characteristics of the device of FIG. 3a.

FIG. 4a is a 4-state up-down binary counter circuit of the prior art equivalent to FIG. 3a.

FIG. 4b is the transition states of FIG. 4a.

FIG. 5a is a schematic of a $4\pi$-range phase detector capable of handling simultaneous inputs.

FIG. 5b are the transition states of the device of FIG. 5a.

FIG. 5c is the equivalent transition states of the device of FIG. 5a.

FIG. 5d is a graph of the output characteristics of the device of FIG. 5a.

FIG. 6b is a graph of the output characteristics of the device of FIG. 6a.

FIG. 7b are the state diagrams of the device of FIG. 7a.

FIG. 7c are the output characteristics of the device of FIG. 7a.

FIG. 8b is a diagram of signals at various points through FIG. 8a.

FIG. 9b shows the output characteristics of the device of FIG. 9a.

DETAILED DESCRIPTION OF THE PRESENT INVENTION

Figure 6A:
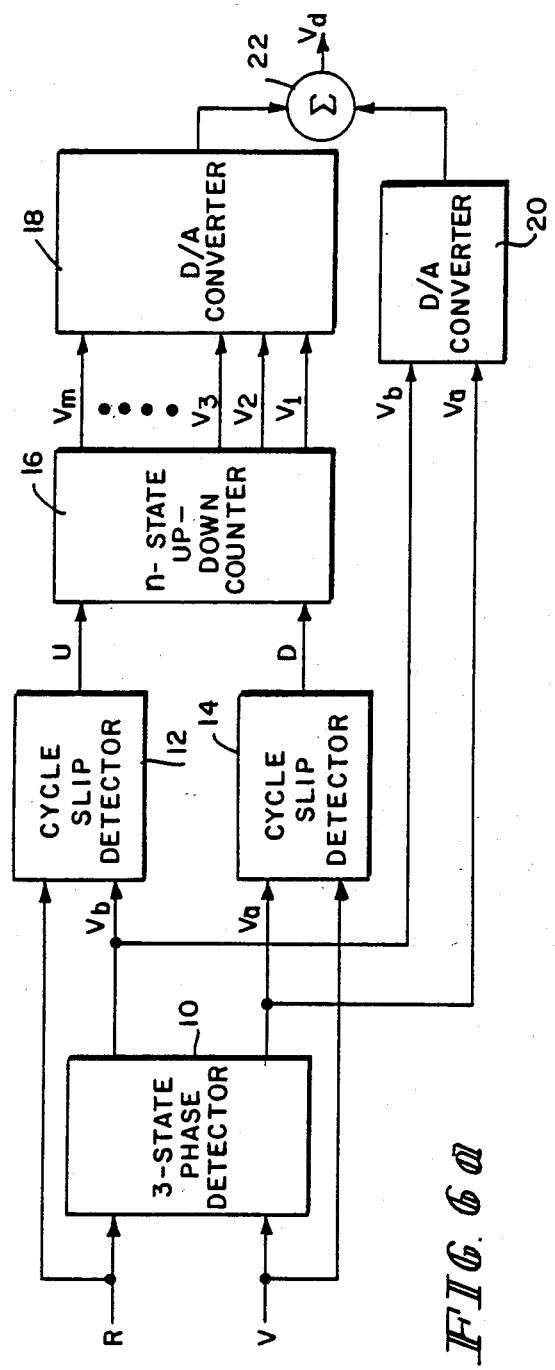
FIG. 6a is a block diagram of a phase detector according to the principles of the present invention.

A phase detector which is capable of handling simultaneous inputs and having a linearity over n+1 cycles is illustrated in FIG. 6a. A pair of inputs R and V are provided to a three-state phase detector 10 which is linear over $4\pi$ and is capable of handling simultaneous inputs without dead zones and non-linearities. A typical example would be the three-state phase detector of FIG. 5a. The range of the phase detector is extended by providing the outputs $V_a$ and $V_b$ from the three-state phase detector 10 to a pair of cycle slip detectors 12 and 14 respectively The other inputs to these cycle slip detectors 12 and 14 are the respective input signals R and V.

The cycle slip detector 12 detects that the three-state phase detector 10 is at its upper count or lead state, and additional inputs of the R signal cause a cycle slip. This cYcle slip produces an up output signal from cycle slip detector 12 as the up input to an n-state up-down counter 16. The cYcle sliP detector 14 equivalently detects that the three-state phase detector is at its lowest count or lag state, and an additional input signal of V causes a cycle slip. In response to this condition the cycle slip detector 14 produces a down output signal D to the n-state up-down counter 16.

Figure 6B:
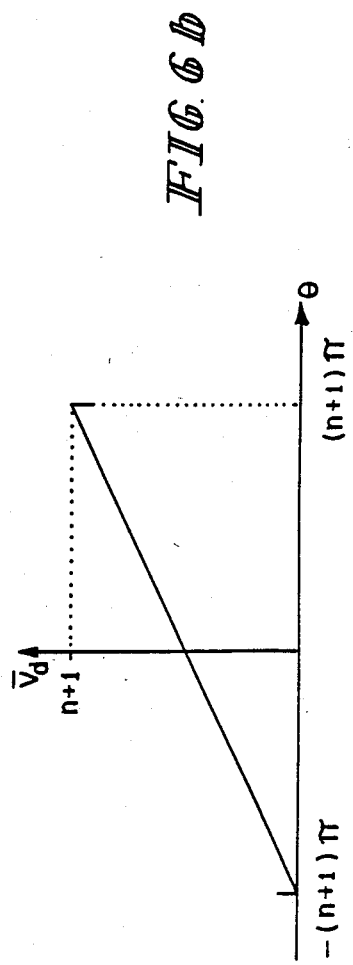

The output of the n-state up-down counter 16 is provided to digital-to-analog converter 18 and the outputs $V_a$ and $V_b$ of the three-state phase detector 10 are provided to digital-to-analog converter 20. The two analog signals are summed at 22 to provide the output signal $V_d$. The graph of the average $\overline{V}_d$ is illustrated in FIG. 6 as having a value of n+1 for n+1 cycles or 2(n+1)π.

Figure 1B:
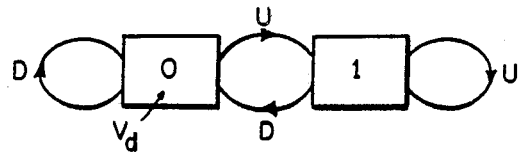
FIG. 1 is a phase detector linear over $2\pi$-range using a bi-directional shift register according to the prior art.
Figure 1A:
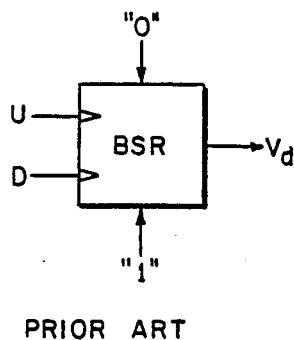
Figure 1C:
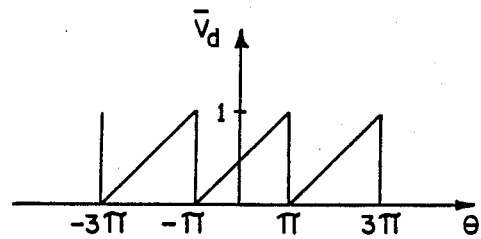
Figure 2A:
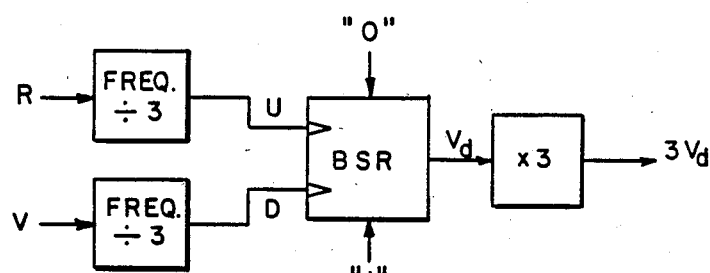
FIG. 2 is a linear phase detector of FIG. 1 extended over $6\pi$-range.
Figure 2B:
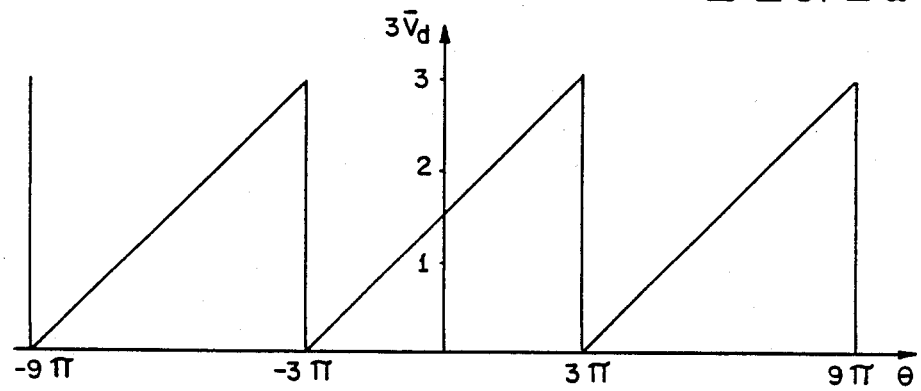
Figure 3A:
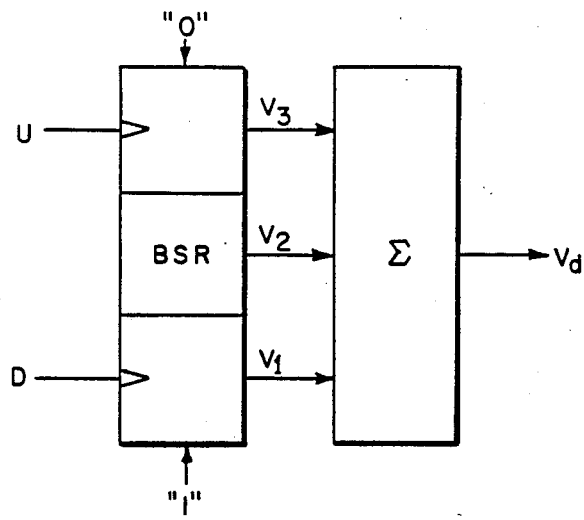
FIG. 3a is a phase detector using a 3-stage bi-directional shift register of the prior art to extend the range over $6\pi$.
Figure 3B:
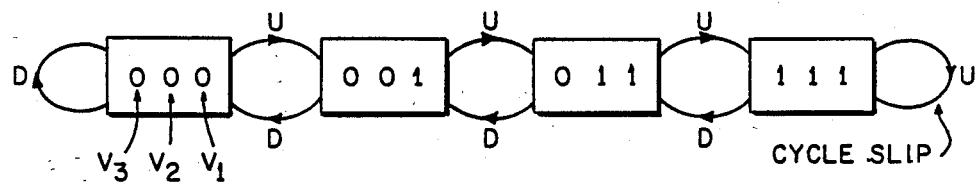
Figure 3C:
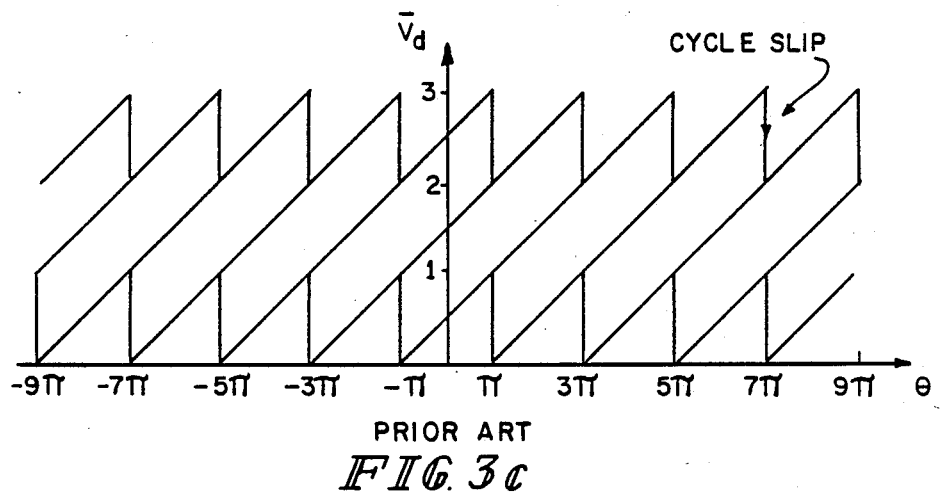
Figure 7A:
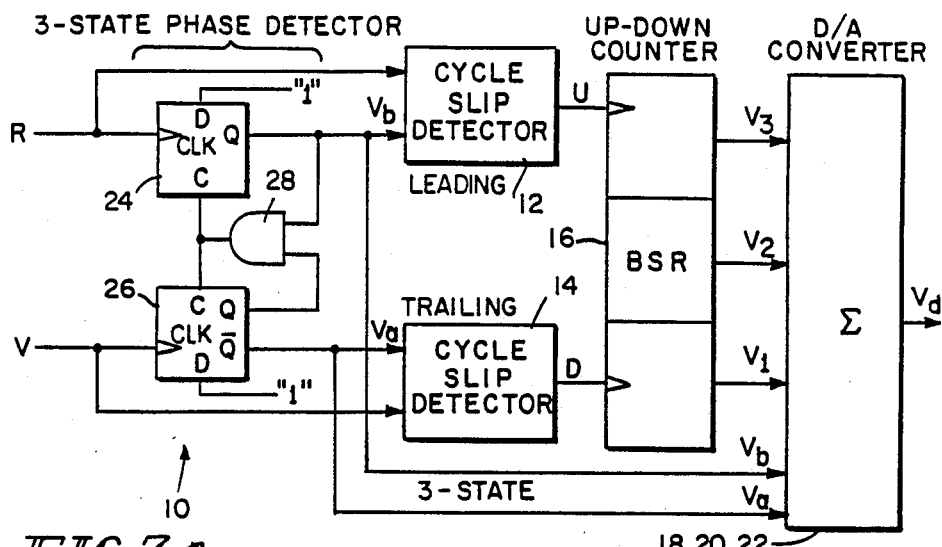
FIG. 7a is an example of a $10\pi$ linear phase detector according to the principles of the present invention.
Figure 7B:
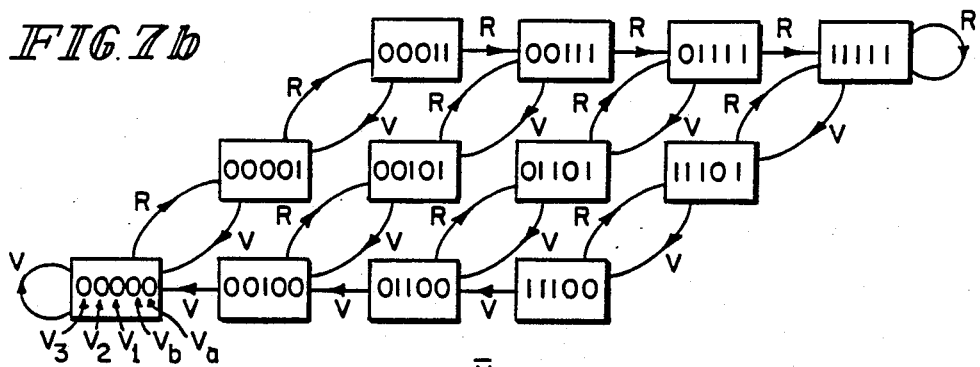

To facilitate understanding of the present phase detector, a 5-cycle phase detector is illustrated in FIG. 7a. The three-state phase detector 10 is that of FIG. 5a and includes a flip-flop 24 connected to the input signal R and providing the output signal $V_b$ and a flip-flop 26 having input signal V providing an output $V_a$. An AND-gate 28 is connected to the Q outputs of the flip-flops 24 and 26 and has an output connected to the clear or reset input C of the flip-flops. These are illustrated as D-type flip-flops. The up-down counter 16 is illustrated as a 3-stage, 4-state bi-directional serial register of FIG. 3a. The digital-to-analog converter and summer are illustrated in a single block.

As is shown in FIG. 5a, when the three-state phase detector 10 reaches the count 11, any additional input R causes a slipped cycle. The cycle slip detector 12 detects this cycle slip and provides an up count to the up-down counter 16. Similarly, when the three-state phase detector 10 reaches the count 00, any additional received signal V causes a cycle slip. The cycle slip detector 14 detects this cycle slip and provides a down count to the up-down counter 16.

A review of the state diagram 7b will show that for every R input, the circuit is advanced to a state with one more 1, and $V_d$ therefore increases by one. Every V input advances the circuit to a state with one less 1, and $V_d$ decreases by one. This holds between states 00000 and 11111. Note that all the vertical transitions are a function of the three-state phase detector, while all the horizontal transitions are a result of cycle slip.

Figure 4A:
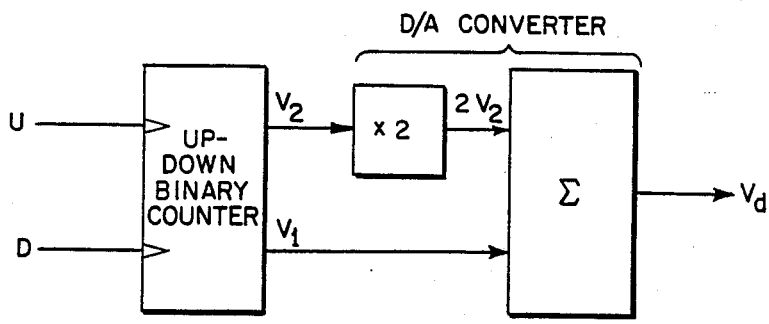
Figure 4B:
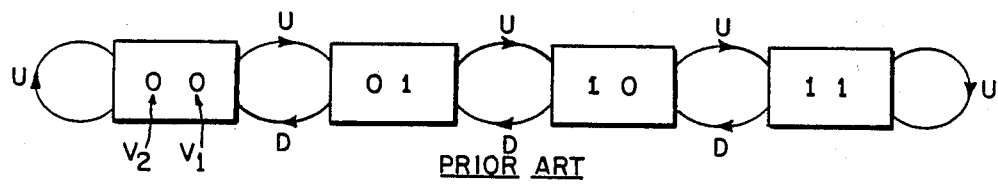
Figure 4C:
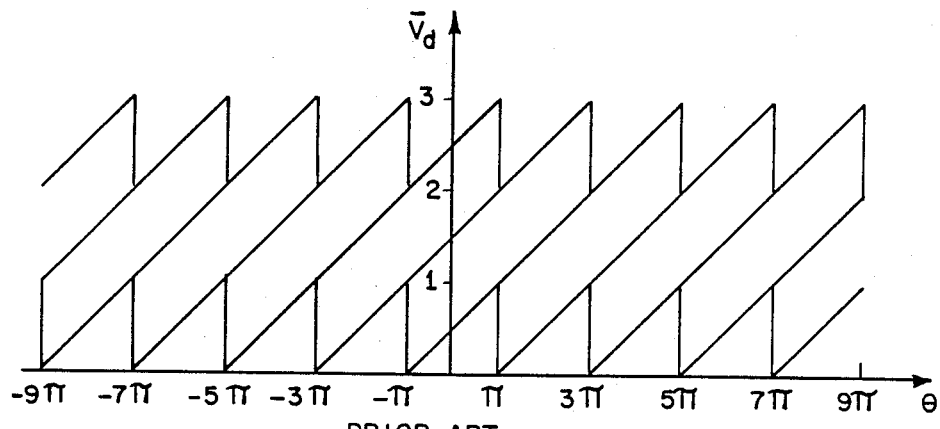
Figure 7C:
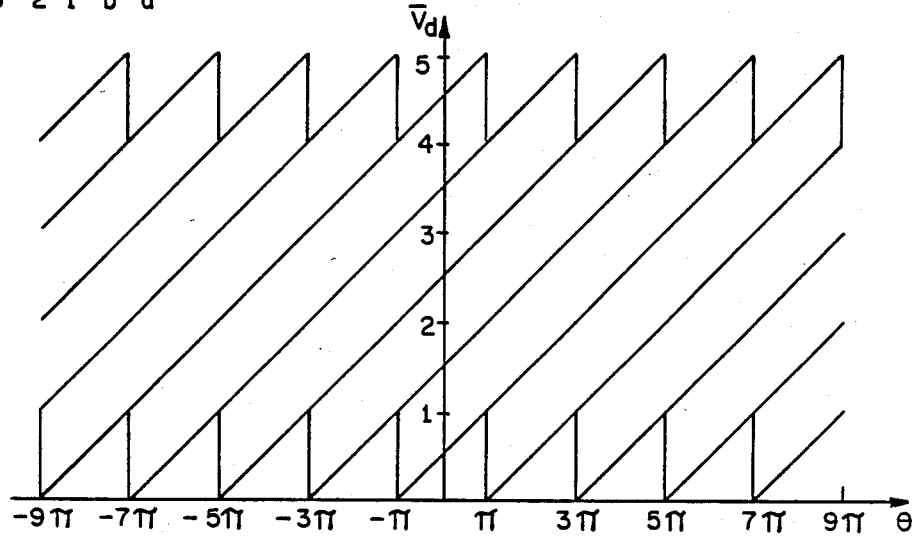

The result is a phase detector characteristic with a linear range of 10π, or five cycles as illustrated in FIG. 7c. Although the bi-directional shift register was shown as the up-down counter 16, from FIG. 3a, it may also be the up-down binary counter with binary weighted outputs of FIG. 4a.

The up-down counter 16 never has to handle simultaneous inputs since leading and trailing cycle slips cannot be simultaneous, thereby overcoming the problems of the prior art. If the cycle slip detector 12 only senses that the state of $V_a$ and $V_b$ is 11 and an additional input is provided, using for example a D-type flip-flop, the detector would not be able to handle simultaneous inputs and therefore would have the same problems as the prior art. A typical example is shown in U.S. Pat. No. 4,587,496. Cycle slip detector 14 would have the same problem if cycle slip detector 14 only sensed that a 00 state occurred and an additional V input is provided, it would also not be able to handle simultaneous inputs.

The present invention overcomes this problem by uniquely detecting a cycle slip. The cycle slip is detected when a positive edge or transition of a respective input signal R/V is not followed within T seconds by a resulting transition on a respective three-state phase detector signal $V_b/V_a$ wherein T is less than the period of R/V and greater than the propagation delay between the edge of R/V and the state change of the three-state phase detector. Alternately stated, the phase detector provides an output signal when a first positive edge of transition of a respective three-state phase detector $V_b/V_a$ occurs after a predetermined time T of a positive edge input signal R/V transition A negative edge or transition may alternatively be used.

Figure 8A:
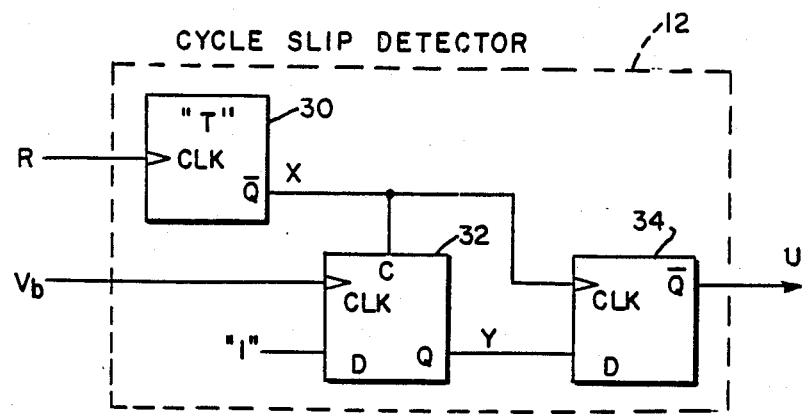
FIG. 8a is a block diagram of a cycle slip detector according to the principles of the present invention.

A preferred embodiment of the lead cycle slip detector 12 is illustrated in FIG. 8a. A timing device 30 illustrated as a monostable multi-vibrator is activated by R on its clock input and provides an output X on its $\overline{Q}$ output at the expiration of the time t after being initiated by the rising edge on R. A D-type input flip-flop 32 has its clock input connected to the input signal $V_b$ from the three-state phase detector and provides a 1 on Y on its Q output for the rising edge of $V_b$. The output Y is connected to the data input of a D-type output flip-flop 34. The signal X is connected to the clear or reset input of D flip-flop 32 and the clock input of D flip-flop 34.

Figure 8B:
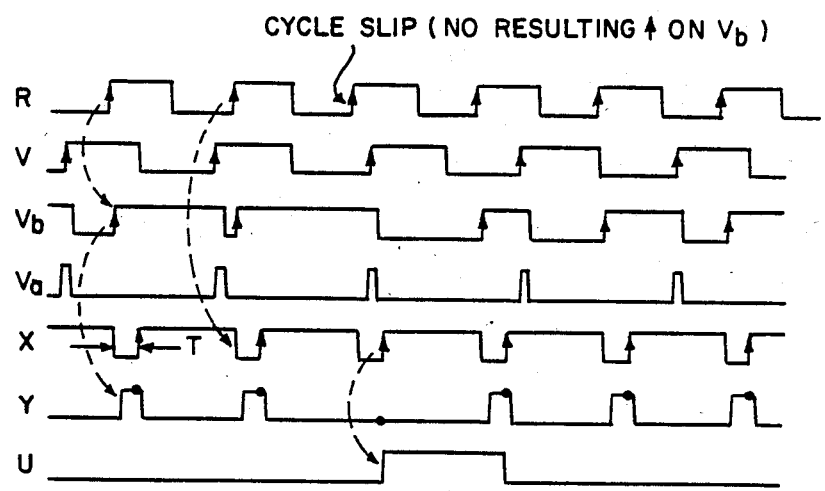

The sequence begins with an R input to the timing device 30 causing X to be low. If $V_b$ has a rising edge on the clock input of D flip-flop 32 before it is cleared by the time-out signal X going high, Y will become high and provide a 1 on the input to the output flip-flop 34. When the clock time-out signal X goes high, the 1 clocks through, causing the output $\overline{Q}$ of the output of 34 to remain low. If $V_b$ does not occur before the time-out signal X goes high, the Y signal on the Q output of the input flip-flop 32 remains low and is clocked through on the time-out signal X on the output of flip-flop 34. This provides a low to high output on the $\overline{Q}$ output providing an up signal U. The timing diagram for the lead cycle slip detector is illustrated in FIG. 8b.

The lag cycle slip detector 14 would have the same structure as illustrated in FIG. 8a wherein the input to the timing device 30 would be the input signal V, the input to the input flip-flop 32 would be $V_a$ with the modification that the input flip-flop 32 would be responsive to the falling edge of the $V_a$ signal. It should be noted that the same slip detector illustrated in FIG. 8a may be used for the leading and lagging cycle slip detectors 12 and 14 with the modification to FIG. 7a that the input to the cycle slip detector would be the $V_a$ signal from the Q output of the flip-flop 26. The output signal $V_a$ is still provided to the digital-to-analog converter 18, 20, 22.

Figure 9A:
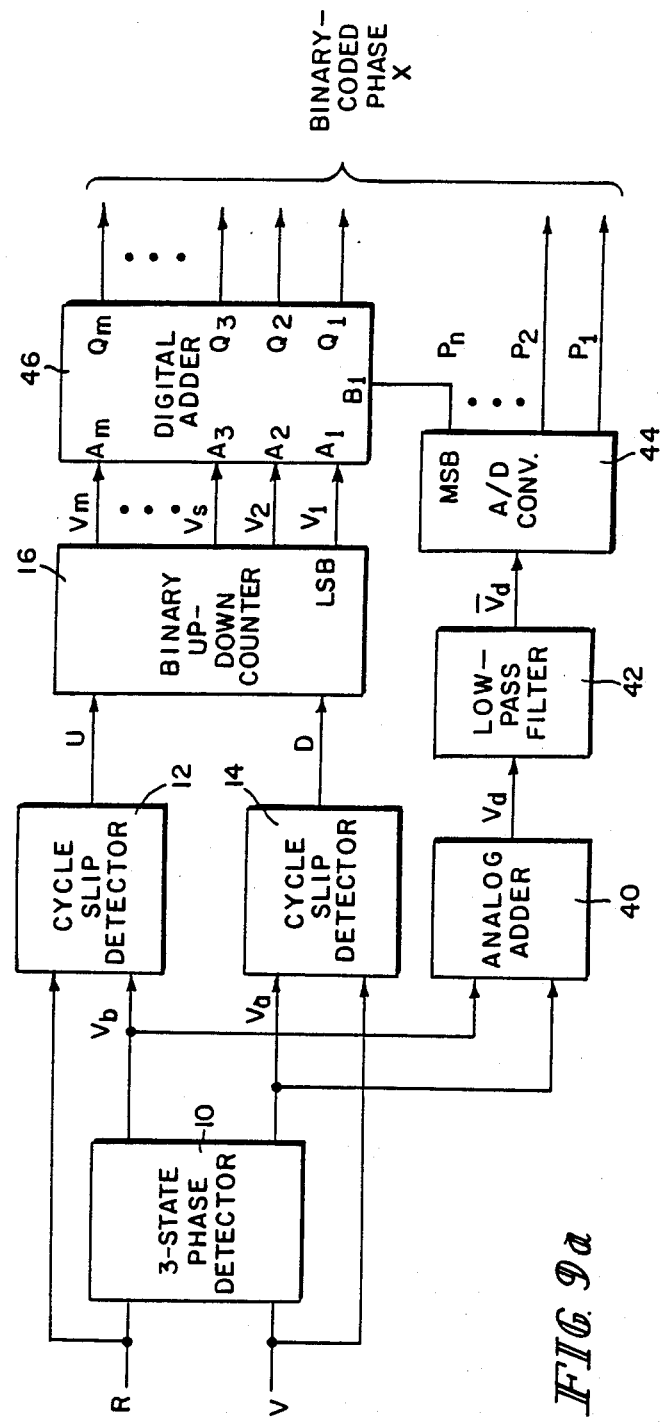
FIG. 9a is a block diagram of a digital, linear phase detector according to the principles of the present invention.

A digital implementation of the present invention equivalent to the analog implementation of FIG. 6a is illustrated in FIG. 9a. The R and V signals are provided to the three-state phase detector 10 as well as to the slip detectors 12 and 14. The outputs $V_b$ and $V_a$ of the three-state phase detector 10 are provided to the cycle slip detectors 12 and 14. The outputs U and D of cycle slip detectors 12 and 14, respectively, are provided to the binary up-down counter 16. The structure at this point is identical to that of FIG. 6a, and the device is operated as previously described.

The outputs $V_a$ and $V_b$ of the three-state phase detector 10 are also provided to an analog adder 40. The output signals $V_a$ and $V_b$ of the three-state phase detector 10 are inherently analog since they are an average of the square wave with a varying duty cycle. The analog adder 40 adds the three-state phase detector 10 output signals $V_a$ and $V_b$ to produce the analog signal $V_d$ which is provided as an input to the low pass filter 42. The low pass filter 42 provides the output $\overline{V}_d$ which is an average. This analog signal $\overline{V}_d$ is converted to a binary coded digital signal by analog-to-digital converter 44. The digital form is represented by bits P1 through Pn.

Figure 9B:
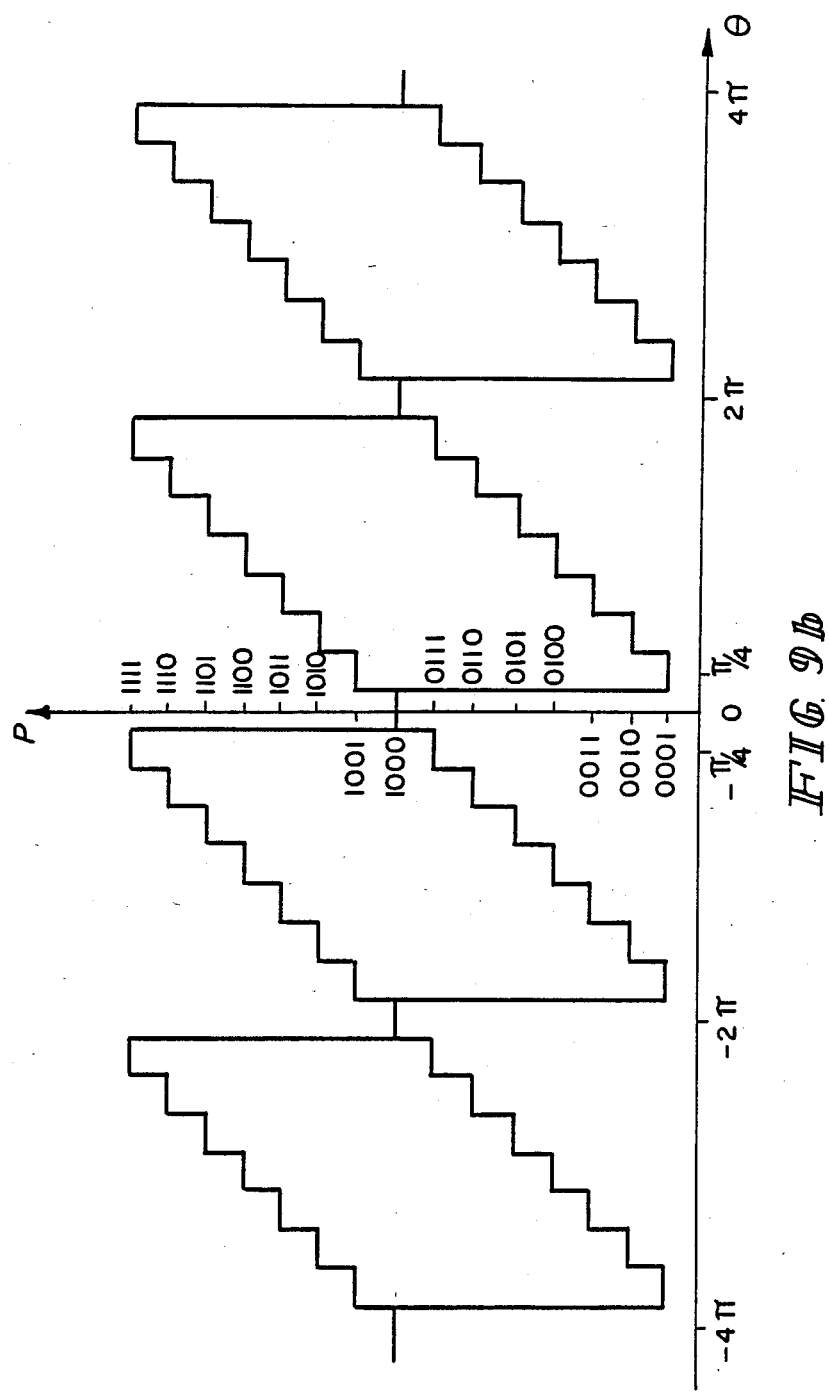

The extension of the range of the digitized three-phase state detector or the output signals P1 through Pn is achieved by combining this output with the output of the up-down counter 16. The output signals V1 through Vm of the binary up-down counter 16 are provided to an m-bit digital adder 46. The most significant bit (MSB) Pn from the three-state phase detector 10 at the output of the analog-to-digital converter 44 is added to the least significant bit (LSB) V1 of the up-down counter 16 in the digital adder 46. The output includes the P1 through Pn-1 and the Q1 through Qm bits. The phase range is $(2^m+1)2\pi$ radians as defined by the output Q1 through Qm and the resolution is $2\pi/(2^{n-1})$ radians as defined by P1 through Pn-1. An example of the output P1 through Pn is illustrated in FIG. 9b where n=4.

To illustrate the operation of the digital circuit of FIG. 9a, we will assume an example where m=n=4, the binary word V from the binary up-down counter 16 is equal to 0011, and the binary number P from the analog-to-digital converter 44 is 1111. Referring to FIG. 9b, the P of 1111 corresponds to the phase of $-\pi/4$. Adding the most significant bit of P to the least significant bit of V is equivalent to multiplying V by 8 (or shifting it three places) and adding it to P resulting in the number 0100111, which is the binary equivalent of decimal 39. This value is the output phase measured in increments of $\pi/4$. Assume that the phase increases from $-/4$ to zero. Thus, P goes from 1111 to 1000 as illustrated in FIG. 9b. This sudden drop in the value of P corresponds to a cycle slip, and the count V counts up from the value of 0011 to the value 0100. Adding the new value of P=1000 to the shifted value of V of 0100 produces an output of 0101000 which is the binary equivalent of digital 40. Thus an increase of phase by $\pi/4$ has caused the digital output to be increased by 1, which is the desired result.

To illustrate a down cycle slip, assume that the phase is $\pi/4$ with P equaling 0001 and the V of the up-down counter equals 0101. Thus, the digital output is equal to 0101001 or the decimal equivalent of 41. If the phase decreases to zero, P becomes 1000, and the cycle slip causes V to count down from 0101 to 0100. The digital output then becomes 0101000, which is the decimal equivalent of 40. Thus a decrease in $\pi/4$ in phase has decreased the digital output by 1. Thus, the digital version, as the analog version, provides an extended range without the glitches of the prior art.

Although the present invention has been described and illustrated in detail, it is to be clearly understood that the same is by way of illustration and example only, and is not to be taken by way of limitation The spirit and scope of the present invention are to be limited only by the terms of the appended claims.

What is claimed is:

1. A phase detector of n+1 cycle linear range whose output has a fundamental frequency at least as high as a fundamental frequency of its input signals comprising:
   first and second input means for receiving first and second input signals whose phase relationship is to be detected;
   three-state phase detector means connected to said first and second input means for producing state output signals representing lead, lag and center states as a function of the phase relationship of said first to said second input signals linearly over two cycles;
   cycle slip detector means connected to said first and second input means and said three-state phase detector means and responsive to said input signals and said state output signals for providing an up signal when said first input signal leads said second input signal by more than one cycle and a down signal when said first input signal lags said second input signal by more than one cycle;
   n-state up-down counter means connected to said cycle slip detector means for providing a count output as a function of said up and down signals; and
   output means connected to said up-down counter means and said three-state phase detector means for providing a phase output signal linear over n+1 cycles as a function of said count output and state output signals.

2. A phase detector according to claim 1, wherein said three-state phase detector means is linear without dead zones over n+1 cycles.

3. A phase detector according to claim 1, wherein said three-state phase detector means accurately responds to simultaneous first and second input signals.

4. A phase detector according to claim 3, wherein said three-state phase detector means is responsive to input signal transitions.

5. A phase detector according to claim 3, wherein said cycle slip detector means accurately responds to simultaneous first and second input signals.

6. A phase detector according to claim 1, wherein said three-state phase detector means has lead, lag and center stable states and one transition state with a respective state output signal, said transition state is for state changes between said lead and lag signals and said center signal and for simultaneous input signals.

7. A phase detector according to claim 6, wherein said cycle slip detector means includes:
   lead means for providing said up signal when a first resulting change of output signals of said three-state phase detector means occurs after a predetermined time after said first input signal; and
   lag means for providing said down signal when a second resulting change of output signals of said three-state phase detector occurs after said predetermined time after said second input signal.

8. A phase detector according to claim 6, wherein said transition state is a state for transitions from said lag state to said center state, transitions from said lead state to said center state and for transitions from said center state and back to said center state simultaneous inputs state.

9. A phase detector according to claim 1, wherein said three-state phase detector includes:
   first flip-flop means having an input connected to said first input means for being set by said first input signal and an output connected to said cycle slip detector means;
   second flip-flop means having an input connected to said second input means for being set by said second input signal and an output connected to said cycle slip detector means; and
   logic means connected to said first and second flip-flop means for resetting said first and second flip-flop means when both of said flip-flop means are in a set state simultaneously.

10. A phase detector according to claim 9, wherein said output of said first and second flip-flop means is Q and $\overline{Q}$ respectively.

11. A phase detector according to claim 9, wherein said cycle slip detector means includes:
   lead means for providing said up signal when a first resulting change of output signals of said first flip-flop means occurs after a predetermined time after said first input signal; and
   lag means for providing said down signal when a second resulting change of output signal of said second flip-flop means occurs after said predetermined time after said second input signal.

12. A phase detector according to claim 11, wherein said lead means and said lag means each include:
   timing means initiated by a respective first or second input signal for providing a time-out signal after expiration of said predetermined time;
   an input flip-flop means set by said predetermined change of said output signal of a respective first or second flip-flop means and reset by said time-out signal and having a Q output; and
   output flip-flop means set by said simultaneous occurrence of said time-out signal and Q output signal from said input flip-flop means and having a $\overline{Q}$ output for providing said respective up or down signal.

13. A phase detector of n+1 cycle linear range whose output has a fundamental frequency at least as high as a fundamental frequency of its input signals comprising:
   first and second input means for receiving first and second input signals whose phase relationship is to be detected;
   three-state phase detector means connected to said first and second input means for producing state output signals representing lead, lag and center states, as a function of the phase relationship of said first to said second input signals linearly over two cycles;
   cycle slip detector means connected to said first and second input means and said three-state phase detector means and including (a) lead means for providing an up signals when a first resulting change of output signals of said three-state phase detector means occurs after a predetermined time after said first input signal, indicating that said first input signal leads said second input signal by more than one cycle, and (b) lag means for providing a down signal when a second resulting change of output signals of said three-state phase detector occurs after said predetermined time after said second input signal, indicating that said first input signal lags said second input signal by more than one cycle;
   n-state up-down counter means connected to said cycle slip detector means for providing a count output as a function of said up and down signals; and
   output means connected to said up-down counter means and said three-state phase detector means for providing a phase output signal linear over n+1 cycles as a function of said count output and state output signal.

14. A phase detector according to claim 13, wherein said lead means and said lag means each include:
   timing means initiated by a respective first or second input signal for providing a time-out signal after expiration of said predetermined time;
   an input flip-flop means set by a respective first or second predetermined change of said output signal of said three-state phase detector means and reset by said time-out signal and having a Q output; and
   output flip-flop means set by said simultaneous occurrence of said time-out signal and Q output signal from said input flip-flop means and having a $\overline{Q}$ output for providing said respective up or down signal.

15. A phase detector according to claim 1, wherein said up-down counter means includes an n−1 stage bi-directional shift register having n−1 outputs.

16. A phase detector of n+1 cycle linear range whose output has a fundamental frequency at least as high as a fundamental frequency of its input signals comprising:
   first and second input means for receiving first and second input signals whose phase relationship is to be detected;
   three-state phase detector means connected to said first and second input means for producing state output signals representing lead, lag and center as a function of the phase relationship of said first to said second input signals linearly over two cycles;
   cycle slip detector means connected to said first and second input means and said three-state phase detector means and responsive to said input and state output signals for providing an up signal when said first input signal leads said second input signal by more than one cycle and a down signal when said first input signal lags said second input signal by more than one cycle;
   n-state up-down counter means connected to said cycle slip detector means for providing a count output as a function of said up and down signals; and
   output means connected to said up-down counter means and said three-state phase detector means for providing a phase output signal linear over n+1 cycle and including (a) a first digital-to-analog converter for converting said count output to an analog count signal, (b) a second digital-to-analog converter for converting said state output signal representing lead, lag and center states into an analog phase detector signal, and (c) summer means for providing an analog sum of said analog count and phase detector signals.

17. As a phase detector comprising:
   first and second input means for receiving first and second input signals;
   three-state phase detector means connected to said first and second input means for providing a first and second phase signal output which define three stable states;
   cycle slip detector means connected to said first and second input means and said first and second phase signal outputs for providing an up signal when a first resulting change of a signal of said first phase signal output occurs after a predetermined time after said first input signal and a down signal when a second resulting change of signal of said second phase signal output occurs after said predetermined time after said second input signal;
   n-state up-down counter means connected to said cycle slip detector means for providing a count output as a function of said up and down signals; and
   output means connected to said up-down counter means and said three-state phase detector means for providing a phase output signal linear over n+1 cycles as a function of said count output and said first and second phase signal outputs.

18. A phase detector according to claim 17, wherein said three-state phase detector includes:
   first flip-flop means having an input connected to said first input means for being set by said first input signals and an output connected to said cycle slip detector means;
   second flip-flop means having an input connected to said second input means for being set by said second input signal and an output connected to said cycle slip detector means; and logic means connected to said first and second flip-flop means for resetting said first and second flip-flop means when both of said flip-flop means are in a set state simultaneously.

19. A phase detector according to claim 18, wherein said output of said first and second flip-flop means is Q and $\overline{Q}$ output respectively.

20. A phase detector according to claim 17, wherein said cycle slip detector means includes a pair of:

timing means initiated by a respective first or second input signal for providing a time-out signal after expiration of said predetermined time;

an input flip-flop means set by a respective first or second resulting change of said output signal of said three-state phase detector means and reset by said time-out signal and having a Q output; and output flip-flop means set by said simultaneous occurrence of said time-out signal and Q output signal from said input flip-flop means and having a $\overline{Q}$ output for providing said respective up or down signal.

21. A phase detector of n+1 cycle linear range whose output has a fundamental frequency at least as high as a fundamental frequency of its input signals comprising:

first and second input means for receiving first and second input signals whose phase relationship is to be detected;

three-state phase detector means connected to said first and second input means for producing state output signals representing lead, lag and center states, as a function of the phase relationship of said first to said second input signals linearly over two cycles;

cycle slip detector means connected to said first and second input means and said three-state phase detector means and responsive to said input and state output signals for providing an up signal when said first input signal leads said second input signal by more than one cycle and a down signal when said first input signal lags said second input signal by more than one cycle;

n-state up-down counter means connected to said cycle slip detector means for providing a count output as an m-bit digital word V as a function of said up and down signals; and output means connected to said up-down counter means and said three-state phase detector means for providing a phase output signal linear over n+1 cycles and including (a) converting means connected to said three-state phase detector means for converting said state output signals into an n-bit digital word P, (b) adder means connected to said counter means and said converting means for adding a most significant bit of said word P to a least significant bit of word V and for providing an m-bit digital output work Q, and (c) said phase output signal is output Q and $P_1$, through $P_{n-1}$.

* * * * *